United States Patent [19]

Henricks et al.

[11] Patent Number: 4,729,799

[45] Date of Patent: Mar. 8, 1988

[54] STRESS RELIEF OF SINGLE CRYSTAL SUPERALLOY ARTICLES

[75] Inventors: Robert J. Henricks, Farmington; John J. Marcin, Hartford; Jacqueline B. Wahl, Willington, all of Conn.

[73] Assignee: United Technologies Corporation, Hartford, Conn.

[21] Appl. No.: 880,603

[22] Filed: Jun. 30, 1986

[51] Int. Cl.⁴ .................................. C22F 1/10
[52] U.S. Cl. ............................ 148/13; 148/20.3; 148/404
[58] Field of Search ................ 148/13, 20.3, 404

[56] References Cited

U.S. PATENT DOCUMENTS

| | | | |
|---|---|---|---|
| 2,766,156 | 10/1956 | Betteridge | 148/162 |
| 3,174,851 | 3/1965 | Buehler et al. | 148/162 |
| 3,203,792 | 8/1965 | Scheil et al. | 148/162 |
| 3,536,542 | 10/1970 | Murphy et al. | 148/162 |
| 3,544,348 | 12/1970 | Boone et al. | 117/2 |
| 3,578,440 | 3/1971 | Eiselstein et al. | 75/170 |
| 3,627,593 | 12/1971 | Ansuini | 148/32 |
| 3,653,987 | 4/1972 | Boesch | 148/162 |
| 3,928,026 | 12/1975 | Hecht et al. | 75/134 |
| 4,005,989 | 2/1977 | Preston | 29/194 |
| 4,083,734 | 4/1978 | Boesch | 148/32.5 |
| 4,116,723 | 9/1978 | Gell et al. | 148/3 |
| 4,132,816 | 1/1979 | Benden et al. | 427/237 |
| 4,176,433 | 12/1979 | Lee et al. | 29/156.8 B |
| 4,209,348 | 6/1980 | Duhl et al. | 148/3 |
| 4,253,884 | 3/1981 | Maurer et al. | 148/13.1 |
| 4,253,885 | 3/1981 | Maurer et al. | 148/13.1 |
| 4,371,404 | 2/1983 | Duhl et al. | 148/3 |
| 4,465,530 | 8/1984 | Kagohara | 148/410 |
| 4,512,817 | 4/1985 | Duhl et al. | 148/3 |
| 4,531,981 | 2/1984 | Singer | 148/11.5 |
| 4,583,608 | 4/1986 | Field et al. | 148/1 |

Primary Examiner—R. Dean
Attorney, Agent, or Firm—William J. Sapone

[57] ABSTRACT

A coated nickel base superalloy single crystal turbine airfoil blade (1), which is subject to gas turbine engine operation, can crack during refurbishment by a stress corrosion mechanism when exposed to certain corrosive media. The rapid thermal cycling that occurs during typical gas turbine engine operation results in high, non-uniform stresses across the airfoil, producing large localized residual strains in the article at ambient temperatures. Exposure to a corrosive environment, such as during coating removal or agressive cleaning, can produce chordwise cracks in a large number of the airfoils exposed. Such cracking is avoided by subjecting the articles to a preliminary stress relieving heat treatment which reduces the residual strains to a level below which cracking will not occur, prior to exposure to the corrosive media.

12 Claims, 1 Drawing Figure

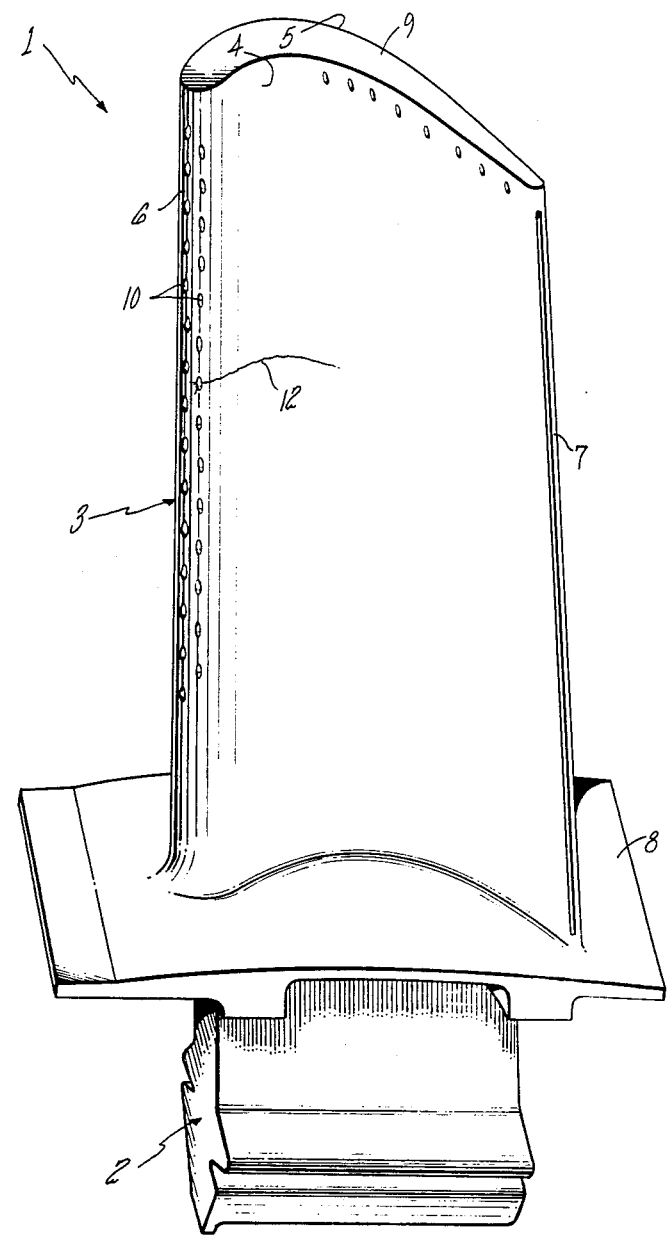

STRESS RELIEF OF SINGLE CRYSTAL SUPERALLOY ARTICLES

DESCRIPTION

1. Technical Field

This invention relates to refurbishing gas turbine engine components, and more particularly, to a method of reducing residual tensile strains in single crystal superalloy airfoil blades and vanes.

2. Background Art

An axial gas turbine engine includes a compressor section, a combustion section, and an aft turbine section. Disposed within the turbine section are alternating rows of rotatable airfoil blades and static vanes. As hot combustion gases pass through the turbine section, the airfoil blades are rotatably driven, turning a shaft and thereby providing shaft work for driving the compressor section and other auxilliary systems. The higher the gas temperature, the more work that can be extracted in the turbine section. In an effort to increase the turbine section operating temperature, nickel base superalloy materials are used to produce the turbine airfoil blades and vanes. Such materials maintain mechanical strength at high temperatures.

In particular, single crystal nickel base superalloy airfoil blades and vanes are used which provide mechanical strength at high temperatures while limiting the potential for structural failure by eliminating weak grain boundaries within the alloy structure. Such articles usually include a coating which provides increased corrosion resistance and/or enhanced thermal protection, with either an overlay or diffusion bonded aluminide coating generally preferred. U.S. Pat. Nos. 3,544,348 to Boone et al and 4,132,816 to Benden et al, disclose various methods for applying aluminide coatings to superalloy articles, U.S. Pat. No. 3,928,026 to Hecht et al, discloses a typical overlay coating, and U.S. Pat. No. 4,005,989 to Preston, discloses a combined overlay/aluminide coating. All the above patents are commonly assigned to the assignee of the present invention.

An overhaul of a gas turbine engine involves the disassembly, inspection, repair/replacement of worn parts and reassembly of the engine. Of particular importance is the condition of the turbine section blades and vanes which are subject to cyclic high temperature operation. In U.S. Pat. No. 4,176,433 to Lee et al, herein incorporated by reference, a method of remanufacturing turbine vane clusters is disclosed. The method involves a visual inspection to select reuseable vanes within a cluster, followed by coating removal and other processing steps. While such a method is disclosed for remanufacturing vane clusters, it is illustrative of general overhaul procedures for both airfoil blades and vanes.

An airfoil blade or vane which requires repair must be cleaned and have the coating removed from all surfaces, otherwise detrimental alloy melting may occur during subsequent operations, resulting in subsurface voids or imperfections. Coating removal is usually accomplished by immersing the coated article in a hot acid bath consisting of, for example, boiling hydrochloric acid (HCl).

According to this general procedure, a group of used single crystal airfoil blades, having an aluminide coating on both the internal and external surfaces and an additional overlay coating on the external surface, was immersed in boiling HCl to remove the coatings. After coating removal, the blades were inspected and a significant number found to be damaged beyond repair by cracks which initiated in the corrosive environment of the acid bath. Of 53 articles exposed to the acid, 26 developed chordwise cracks, for a 49% failure rate. Such a high rate of failure results in significant increases in the cost of overhauling gas turbine engines which utilize single crystal articles. Consequently, a need arose to determine the cause of the cracking problem and to define proper procedures to prevent damaging the single crystal superalloy airfoil articles during refurbishment.

DISCLOSURE OF THE INVENTION

It is an object of the present invention to determine the cause of the cracking problem which occurs during the removal of a coating from a used single crystal superalloy article.

It is a further object of the present invention to define a method for preventing cracking of used single crystal superalloy articles during an engine overhaul.

These and other objects of the present invention are achieved by subjecting a used single crystal article to a preliminary heat treatment prior to exposure to a corrosive environment. Such a heat treatment relieves residual strains which accumulate during cyclic engine operation, which, if not relieved, produce stress cracks in used single crystal articles when exposed to a corrosive environment, such as that required for cleaning or coating removal. Generally, subjecting such an article to a heat treatment at a temperature of 1750°–2050° F. for 1–4 hours in either a non-oxidizing atmosphere or under vacuum achieves a suffient reduction in residual strains to prevent cracking in single crystal articles.

BRIEF DESCRIPTION OF THE DRAWING

FIG. 1 is a prospective view of a used single crystal airfoil blade, illustrating a typical chordwise crack which developed during exposure of the airfoil blade to a corrosive environment.

BEST MODE FOR CARRYING OUT THE INVENTION

Referring to FIG. 1, a used single crystal airfoil blade 1 is shown. The blade 1 includes a root 2 and an airfoil 3 having a concave surface 4, a convex surface 5, a leading edge 6, a trailing egde 7, a platform 8, and a tip 9. The blade 1 also includes internal cooling passages 10 which direct relatively cool air through the blade to allow operation at high temperatures. The blade 1 also previously included a surface coating 11 (not shown) on both the inner and outer surfaces which was removed. The coating may have been either a diffusion or overlay coating such as those described in U.S. Pat. Nos. 3,928,026, 3,544,348 and 4,132,816, or a combination thereof, as described in U.S. Pat. No. 4,005,989, all hereby incorporated by reference. The blade 1, as well as those other blades and vanes to which the present invention applies, are of the type used in the turbine section of a gas turbine engine, and are composed of single crystal nickel base superalloys, such as that disclosed in U.S. Pat. No. 4,209,348 to Duhl et al.

Generally, an overhaul of a gas turbine engine involves disassembly, inspection, repair/replacement and reassembly, with the condition of the turbine section blades and vanes requiring particular attention due to the harsh operating conditions encountered in the hot turbine section. Typically, an airfoil blade with a cooling passage may be exposed to 1000° to 1200° F. air in the cooling passage and 2000° to 2200° F. gas on the external surface. It has been discovered that the rapid acceleration and deacceleration that occurs during typical cyclic gas turbine engine operation produces rapid heating and cooling of the airfoil blade, and results in high, non-uniform stresses. These local concentrated stresses can be quite high, due to the complex structural geometry required for a superalloy blade to survive the high turbine operating temperatures, the large thermal gradients encountered and the rapidity of thermal cycling. Such stresses produce high residual strains in certain locations of the airfoil at ambient temperatures which can result in material cracking problems in used high time single crystal articles in the presence of corrosive environments, which may be encountered during either article cleaning or coating removal.

In particular, coated nickel base superalloy single crystal turbine airfoil blades, which are subject to gas turbine engine operation for 2000 to 10,000 hours, can crack from a stress corrosion mechanism when exposed to certain corrosive media. Bulk spanwise residual tensile strains of 1,000 to 1,500 microinches per inch were sufficient to create chordwise cracks at airfoil locations in 26 of 53 parts exposed to boiling hydrochloric acid. Spanwise strains are developed as the airfoil is subject to centripetal forces during engine operation. These strains within the superalloy are measured from the root platform 8 to the blade tip 9 by positioning a number of strain gauges about the article, slicing through a portion and measuring the strain relaxation. Refering to FIG. 1, a typical chordwise crack 12 is shown on a nickel base single crystal superalloy airfoil blade, the crack being perpendicular to the spanwise strain.

Only single crystal articles have displayed this cracking mechanism. Other non-single crystal superalloy articles which have undergone similar stresses and strains in engine operation have not cracked under similar processing conditions. While it is not completely understood, it is believed that the cracking mechanism involves an interaction between the free hydrogen liberated during reaction of the acid with the coating and flaws in the microstructure of the single crystal superalloy. It is possible that the absence of hydrogen accomodating grain boundaries in single crystal articles results in the hydrogen atoms diffusing into flaws in the alloy microstructure, aggravating the flaw and producing a crack. Such flaws are probably exaggerated by the residual strain in the alloy, providing a site for cracking to occur.

To prevent such stress cracking, it is necessary to eliminate either the residual strains or the corrosive environment. The incorporation of a stress relief heat treatment, which would reduce the room temperature residual strains to below a threshhold level where stress corrosion cracking will not occur, is the most economic and least disruptive solution. It will be understood by one skilled in the art that the threshold level will vary between articles depending on the article material, geometry, number and range of thermal cycles encountered, and the actual residual strain developed. Generally, subjecting an article to a heat treatment at a temperature of 1750°-2050° F. for 1-4 hours in either a non-oxidizing atmosphere or under vacuum achieves a suffient reduction in residual strains to prevent cracking in single crystal articles.

For most of the articles tested, it was found that a 50% reduction in residual strain was sufficient to prevent cracking upon exposure of the article to a corrosive environment. While a reduction of 20-30% may prevent cracking in some articles, a 50% reduction offers an additional margin of safety.

EXAMPLE

A group of used single crystal nickel base superalloy airfoil blades were subjected to a pre-inspection heat treatment prior to coating removal. These blades were identical in terms of engine hours, material and structural geometry to the previously discussed group which experienced a 49% failure rate. A control group was strain gauged and found to have accumulated residual tensile strains of from 1000 to 1500 microinches per inch prior to the heat treatment. The subject airfoils were then heated to 1975° F. and held for four hours in a non-oxidizing atmosphere. Hydrogen was used in this example, however, other non-oxidizing gases such as argon or nitrogen could be substituted. After cooling, the airfoil blades were evaluated and found to have undergone a reduction in residual tensile strains from 1000 to 1500 microinches per inch to 400 to 700 microinches per inch. The airfoil blades were then immersed in a boiling HCl bath for coating removal. Of the 41 articles exposed, none were found to exhibit any cracks after coating removal.

While heat treating an article to reduce residual strains is well known, it was not known that single crystal articles had the tendency to crack after accumulating residual strains or that reducing these residual strains to below a threshhold level would prevent cracking during refurbishment. Utilizing a preliminary stress relieving heat treatment prior to coating removal or aggressive cleaning has prevented significant damage to airfoil articles, reducing part rejection and minimizing engine overhaul costs.

While this invention has been described in relation to an airfoil blade used in a gas turbine engine, it will be understood by those skilled in the art that any single crystal superalloy article subject to thermal operations could benefit from the present invention.

While the preferred embodiment of the present invention is described in relation to a 1975° F. heat treatment for four hours, it will be understood by those skilled in the art that the present invention is not limited to the specific embodiment described and that numerous modifications, for example, in terms of temperature, atmosphere and time, could be made without varying from the scope of the present invention.

Having thus described the invention, what is claimed is:

1. A method for preventing the cracking, upon exposure to a corrosive media, of a single crystal nickel base superalloy article which has accumulated residual strains, said method characterized by prior to said exposure subjecting said article to a stress relieving heat treatment, such that the residual strains are reduced to a level below which cracking will not occur.

2. The method of claim 1 wherein said residual strains are reduced by about 50%.

3. The method of claim 1 wherein said heat treatment involves subjecting said article to a temperature of 1750°-2050° F. for one to four hours in either a non-oxidizing atmosphere or under vacuum.

4. The method of claim 3 wherein said heat treatment involves subjecting said article to a temperature of 1975° F. for four hours in a non-oxidizing atmosphere.

5. A method for preventing the cracking, upon exposure to a corrosive media, of a single crystal nickel base superalloy airfoil article which has accumulated residual strains through cyclic use in a gas turbine engine, said method characterized by prior to said exposure subjecting said article to a stress relieving heat treatment, such that the residual strains are reduced to a level below which cracking will not occur.

6. The method of claim 5 wherein said residual strains are reduced by about 50%.

7. The method of claim 5 wherein said heat treatment involves subjecting said article to a temperature of 1750°–2050° F. for one to four hours in either a non-oxidizing atmosphere or under vacuum.

8. The method of claim 7 wherein said heat treatment involves subjecting said article to a temperature of 1975° F. for four hours in a non-oxidizing atmosphere.

9. The method of claim 1 wherein said article is to be aggresively cleaned by exposure to said corrosive media.

10. The method of claim 1 wherein said article includes a coating, said coating to be removed by exposure to said corrosive media.

11. The method of claim 5 wherein said article is to be aggresively cleaned by exposure to said corrosive media.

12. The method of claim 5 wherein said article includes a coating, said coating to be removed by exposure to said corrosive media.

* * * * *

UNITED STATES PATENT AND TRADEMARK OFFICE
CERTIFICATE OF CORRECTION

PATENT NO. : 4,729,799

DATED : March 8, 1988

INVENTOR(S) : ROBERT J. HENRICKS ET AL

It is certified that error appears in the above-identified patent and that said Letters Patent is hereby corrected as shown below:

On the Title Page:

Add inventor: --Alexander A. Pinkowish, Bristol, Conn.--

Claim 1, Col. 4, Line 62: Delete "below" and insert --at--

Claim 5, Col. 5, Line 11: Delete "below" and insert --at--

Signed and Sealed this

First Day of November, 1988

*Attest:*

DONALD J. QUIGG

*Attesting Officer*   *Commissioner of Patents and Trademarks*